United States Patent
Sanchez

(10) Patent No.: US 7,816,948 B1
(45) Date of Patent: Oct. 19, 2010

(54) VOLTAGE TRANSLATOR

(75) Inventor: Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/481,319

(22) Filed: Jun. 9, 2009

(51) Int. Cl.
*H03K 19/0175* (2006.01)

(52) U.S. Cl. .............................. 326/80; 326/63; 326/81

(58) Field of Classification Search ............. 326/62–63, 326/68, 80–81; 327/333
See application file for complete search history.

(56) References Cited

U.S. PATENT DOCUMENTS

| | | | |
|---|---|---|---|
| 5,739,700 A | | 4/1998 | Martin |
| 6,512,407 B2* | | 1/2003 | Horan et al. ................. 327/333 |
| 6,856,173 B1 | | 2/2005 | Chun |
| 7,173,453 B2* | | 2/2007 | Prather et al. ................. 326/80 |
| 7,667,522 B1* | | 2/2010 | Maung ....................... 327/333 |

\* cited by examiner

*Primary Examiner*—Anh Q Tran
(74) *Attorney, Agent, or Firm*—James L. Clingan, Jr.; Joanna G. Chiu

(57) ABSTRACT

A voltage translator having an input which receives an input signal and an output which provides a level shifted output signal includes a first inverter having an input coupled to receive the input signal, a second inverter having an input coupled to an output of the first inverter, a third inverter having an input coupled to an output of the second inverter, a fourth inverter having an input coupled to receive the input signal and an output coupled to an output of the third inverter, a fifth inverter having an input coupled to an output of the fourth inverter and having an output coupled to the input of the third inverter, and a sixth inverter having an input coupled to the output of the fifth inverter and an output coupled to the output of the voltage translator. The second and fourth inverters are coupled to a calibration voltage supply terminal.

16 Claims, 2 Drawing Sheets

US 7,816,948 B1

VOLTAGE TRANSLATOR

BACKGROUND

1. Field

This disclosure relates generally to integrated circuits, and more specifically, to voltage translator circuits on an integrated circuit.

2. Related Art

Voltage translators have the general purpose of changing the voltage level for a given logic state. As integrated circuits have improved performance through reduced transistor size, the power supply voltage has also reduced for these transistors. For the input and output circuits of the integrated circuit that interface with circuits outside the integrated circuit, a higher supply voltage is often used. As a consequence there is necessarily an interaction between high supply voltage circuits and low supply voltage circuits. This interaction accordingly results in the need for voltage translators. A typical requirement for a voltage translator is that it does require the use of a steady state current. This requirement, however, can make it more difficult to meet other desirable features such as being fast and have low distortion.

Accordingly there is a need for a voltage translator that improves one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A voltage translator accurately matches the duty cycle of an input signal by using two parallel paths in which one path is used to prevent undershoot and overshoot due to Miller capacitance in the other path. This results in the other path providing an output that has relatively low distortion compared to the input. This in turn, by having low distortion, provides an output signal at a lower logic level that accurately represents the duty cycle of the input signal which is provided at higher logic level. This is better understood by reference to the drawings and the following description.

Figure 1:
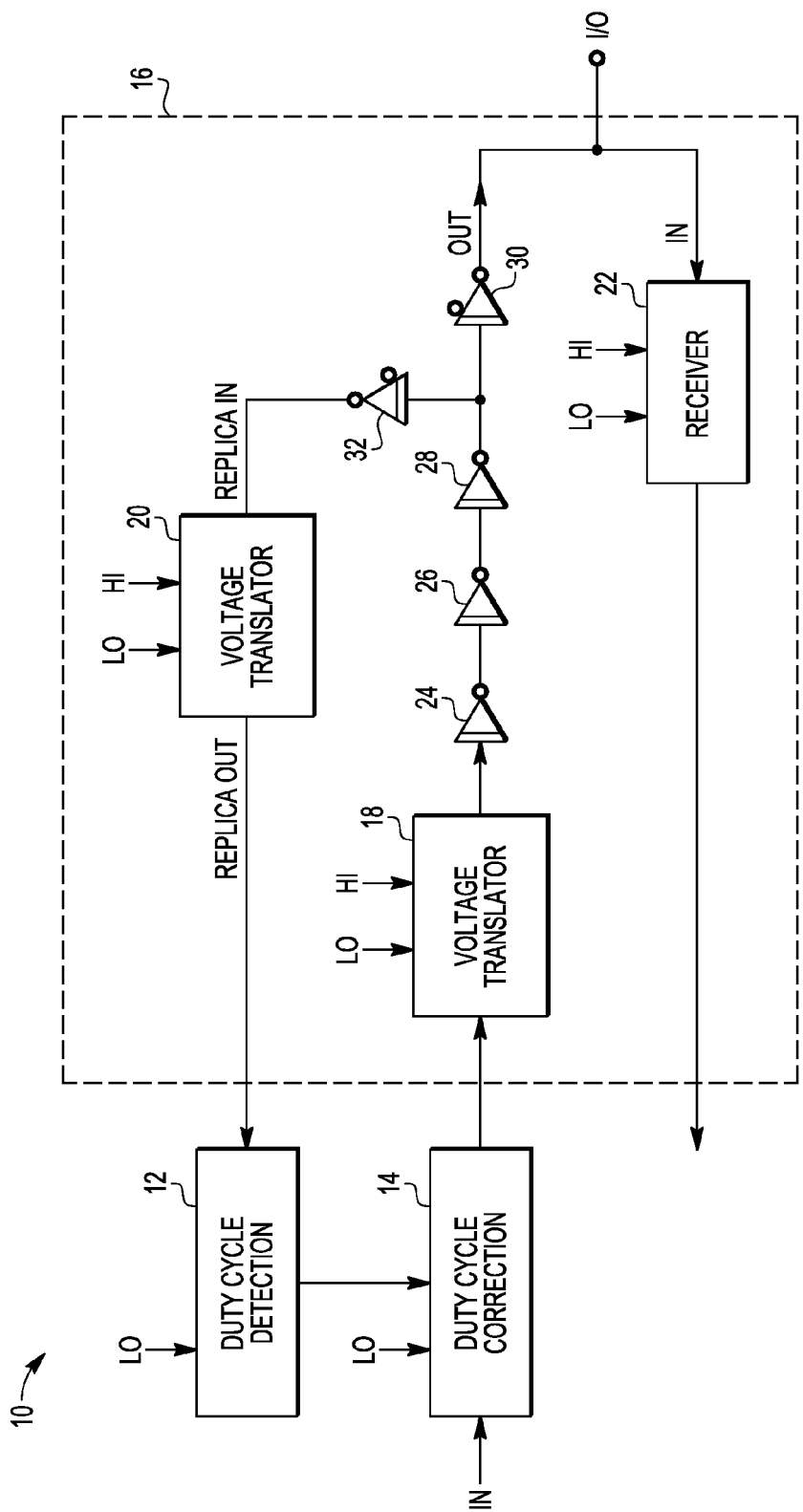
FIG. 1 is a combination block diagram and logic diagram of a circuit including a voltage translator according to an embodiment.

Shown in FIG. 1 is system 10 as part of an integrated circuit comprising a duty cycle detection 12, a duty cycle correction circuit 14, and an Input/output circuit 16. Input/output circuit 16 comprises a voltage translator 18, a receiver 22, an inverter 24, an inverter 26, an inverter 28, and inverter 30, and an inverter 32. An input/output (I/O) terminal is coupled to an input of receiver 22 and an output of inverter 30. Duty cycle detection circuit 12 has an input coupled to an output of voltage translator 20 and an output coupled to an input of duty cycle correction circuit 14. Duty cycle correction circuit correction circuit 14 has an output coupled to an input of voltage translator 18. Inverter 24 has an input coupled to an output of voltage translator 18 and an output. Inverter 26 has an input coupled to the output of inverter 24 and an output. Inverter 28 has an input coupled to the output of inverter 26 and an output. Inverter 30 has an input coupled to the output of inverter 28 and an output coupled to the I/O terminal. Inverter 32 has an input coupled to the output of inverter 28 and an output coupled to an input of voltage translator 20. Inverters 30 and 32, as identified by an additional small circle, are tri-state inverters in which the output of each can be brought to a high impedance state. Inverter 30 must be able to do this in this example because its output is coupled to the I/O terminal. The signal for bringing inverters 30 and 32 to the high impedance condition is not shown. Receiver 22 has an input coupled to the I/O terminal and an output that is used elsewhere in the integrated circuit. Duty cycle detection circuit 12 and duty cycle correction circuit 14 are coupled to a lo terminal which is a power supply terminal for receiving a relatively lower voltage. An example of such a lower voltage may be 1.0 volt. Inverters 24, 26, 28, 30, and 32 are coupled to a hi power supply terminal which is a power supply terminal for receiving a relatively higher voltage. An example of such a higher voltage may be 1.8 volts. Other voltages for the hi and lo terminals may also be used. Voltage translator 18, voltage translator 20, and receiver 22 are coupled to both the hi and lo terminals. The circuits of system are also coupled to ground but could be another negative power supply terminal. Inverters 24, 26, 28, 30, and 32 are made using transistors that can function with the relatively higher power supply voltage and are identified with an extra line parallel to the line where the input is located. Such transistors are high voltage transistors that are made differently than low voltage transistors that are used in making duty cycle detection circuit 12 and duty cycle correction circuit 14. Both high voltage and low voltage transistors are used in making voltage translator 18, voltage translator 20, and receiver 22. A common way of making the high voltage transistors to be able to handle higher voltages is to increase the thickness of the gate dielectric to be greater than the thickness of the gate dielectric of the low voltage transistors.

In operation, duty cycle correction circuit 14 adjusts the duty cycle of an input signal IN and provides the corrected signal to voltage translator 18. Voltage translator 18 performs a voltage translation on the corrected signal provided by duty cycle correction circuit 14 and provides that translated signal to inverter 24. Inverters 24, 26, 28, and 30 provide additional drive so that output signal OUT has a sufficiently low output impedance. Inverter 32 is intended to provide a signal, shown as replica IN, that replicates the signal provided as output signal OUT. Voltage translator 20 converts replica In, which is a signal that swings between a logic high at the higher power supply voltage at terminal hi and ground to a signal shown as replica OUT that swings between a logic high at the lower power supply voltage at terminal lo and ground. Except for the change in the voltage of the logic high, replica OUT is preferably as good a copy of replica IN as possible. Duty cycle detection circuit 12 obtains duty cycle information of replica OUT and provides that information to duty cycle correction circuit 14. Duty cycle correction circuit 14 then adjusts the duty cycle of input signal IN to provide the corrected signal to voltage translator 18. The processing required by duty cycle detection is sufficiently complex that speed of operation of the transistors is important so it is useful for duty cycle detection circuit 12 to be made using the faster, low voltage transistors. Also high voltage transistors typically need to have significantly longer channel lengths than the low voltage transistors so also increase the size of the circuits. The duty cycle calibration process using cycles of duty cycle detection and correction need not be continuous but may be done periodically or upon certain triggering events such as reset or power up. This is most simply done with a input signal being a clock signal, at least during calibration. The result of the calibration is the actual duty cycle correction performed by duty cycle correction circuit 14 as applied to input signal IN but the result may also be duplicated so as to apply duty cycle correction to other signals not shown based on the calibration provided by system 10.

Figure 2:
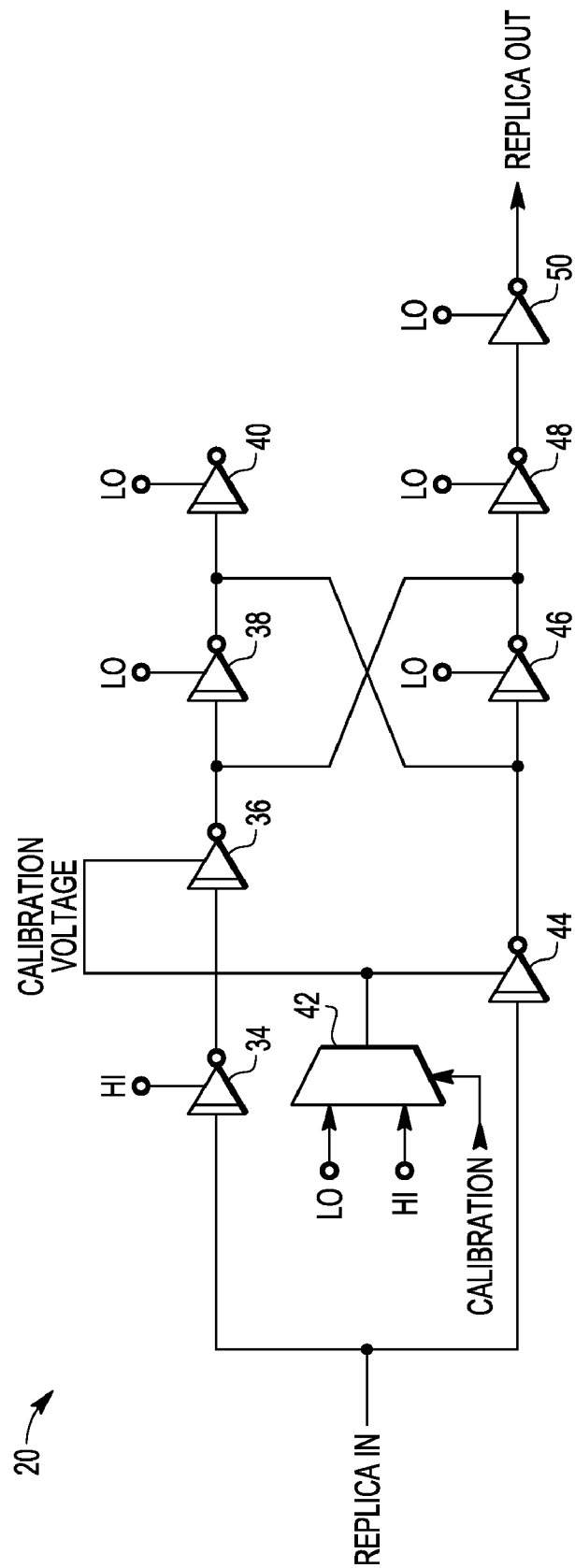
FIG. 2 is a logic diagram of the voltage translator of FIG. 1.

Shown in FIG. 2 is voltage translator 20 in more detail comprising an inverters 34, 36, 38, 40, 44, 46, 48, and 50 and a multiplexer 42. Inverters 34, 36, 38, 40, 44, 46, and 48 are constructed as high voltage inverters. Inverter 50 is shown as a low voltage inverter but could also be a high voltage inverter. Inverters 38, 40, 46, 48, and 50 are coupled to terminal lo and thus are powered by the lower power supply voltage. Inverter 34 is coupled to terminal hi and is thus powered by the higher power supply voltage. Inverter 34 has an input for receiving replica IN and an output. Inverter 36 has an input coupled to the output of inverter 34 and an output. Inverter 38 has an input coupled to the output of inverter 36 and the output of inverter 46 and an output. Inverter 40 has an input coupled to the output of inverter 38 and to the output of inverter 44 and an output that is not coupled to another circuit. Inverter 44 has an input for receiving replica IN and an output. Inverter 46 has an input coupled to the output of inverter 44 and the output of inverter 38 and an output. Inverter 48 has an input coupled to the output of inverter 46 and the output of inverter 36 and an output. Inverter 50 has an input coupled to the output of inverter 48 and an output for providing replica OUT. Multiplexer 42 has a first input coupled to terminal lo, a second input coupled to terminal hi, a control input for receiving a calibration signal, and an output for providing a calibration voltage coupled to power supply terminals of inverters 36 and 44. The calibration voltage is either the higher power supply voltage or the lower power supply voltage. When the calibration signal is active to indicate that system 10 is performing a calibration, the calibration voltage is the higher power supply voltage. Thus, in the calibration mode, inverters 36 and 44 are powered by the higher power supply voltage. When not in the calibration mode, inverters 36 and 44 are powered by the lower power supply voltage.

In operation in the calibration mode, replica IN is received by inverters 34 and 44. Assuming for a first example that replica IN is switching from logic low to a logic high, the initial condition is that inverter 34 is providing a logic high output at the higher power supply voltage, inverter 36 is providing a logic low output, and inverter 38 is providing a logic high output at a voltage between the higher and lower power supply voltages. Inverter 40 is simply providing a matching termination for the output of inverter 38. Inverter 44 is providing a logic high output at the voltage between the higher and lower supply voltages, inverter 46 is providing a logic low output, inverter 48 is providing a logic high output at the lower power supply voltage, and inverter 50 is providing replica OUT at a logic low. With inverters 44 and 38 both having their outputs connected together and both providing a logic high output but being connected to different power supply terminals, the actual output is at a voltage level that is between the higher and lower power supply voltages. In response to replica IN switching to a logic high, inverters 44 and 34 immediately respond. Inverter 34 switches from a logic high to a logic low immediately. Inverter 44 would also switch immediately except that inverter 38 is still holding a logic high for an extended amount of time relative to the initial switching of inverters 44 and 34 which is one buffer delay after inverter 34 switches. This action by inverter 38 helps suppress inverter's 44 miller capacitance-induced power supply overshoot when switching from logic level high to a logic low. Inverter 34 also responds to the transition of replica IN to a logic low by overcoming the initial rise and switches to a logic low. Inverter 34 switches from logic level low to logic level high immediately. Inverter 44 would also switch immediately except that inverter 38 is still holding a logic level low for an extended amount of time relative to the initial switching of inverters 44 and 34 (one buffer delay after inverter 34 switches). This action by inverter 38 helps suppress inverter's 44 miller capacitance-induced power supply undershoot when switching from logic level low to logic level high.

Thus with replica OUT at a logic high in response to replica IN switching to a logic high, inverter 34 provides a logic low, inverter 36 provides a logic high, inverter 38 provides a logic low, inverter 44 provides a logic low, inverter 46 provides a logic high, and inverter 48 provides a logic low. In this condition, inverter 34 responds to replica IN switching to a logic low by providing a logic high output. Due to the Miller capacitance, the output of inverter 44 would go positive, and thus overshoot, due to the high input voltage swing coupling through Miller capacitance to the output, if inverter 38 were not connected to the output of inverter 44. Inverter 44, with its output connected to the logic low output of inverter 38 holds the output of inverter 44 at ground during the time that the input to inverter 44 is rapidly switching downward. After the switching has occurred, the risk of generating the downward spike has passed. Inverter 36 responds to the logic high of the output of inverter by reducing its output. As the output of inverter 44 begins rising inverter 46 responds by providing a current drain on its output so the combined effect of inverters 36 and 46 causes the output of inverter 46 to become a logic low. The logic low of output 46 causes a logic high output from inverter 48 which in turn causes inverter 50 to provide a replica OUT as a logic low.

Thus, the use of inverters 34, 36, and 38 results in the suppression of the adverse effects of Miller capacitance in inverters 44 and 46 which are the inverters of inverters 44, 46, 48, and 50 to be most effected by Miller capacitance because replica IN, which is intended to match output signal OUT has the highest drive current. The result is that voltage translator 20 is very effective in providing replica OUT as a low voltage signal that replicates the duty cycle of replica IN. Inverters 44, 46, 48, and 50 may be viewed as a data path and inverters 34, 36, and 38, especially transistor 38, may be viewed as a second path that receives replica IN and provides delay equalization control of replica OUT, which is a level shifted output signal, provided by the data path.

By not it is apparent there is disclosed a voltage translator having an input which receives an input signal and an output which provides a level shifted output signal. The voltage translator translates the input signal to the level shifted output signal and is coupled to a high voltage supply terminal and a low voltage supply terminal. The voltage translator further includes a first inverter having an input coupled to receive the input signal and having an output, wherein the first inverter is coupled to the high voltage supply terminal. The voltage translator further includes a second inverter having an input coupled to the output of the first inverter and having in output, wherein the second inverter is coupled to a calibration voltage supply terminal. The voltage translator further includes a third inverter having an input coupled to the output of the second inverter and having an output, wherein the third inverter is coupled to the low voltage supply terminal. The voltage translator further includes a fourth inverter having an input coupled to receive the input signal and having an output coupled to the output of the third inverter, wherein the fourth inverter is coupled to the calibration voltage supply terminal. The voltage translator further includes a fifth inverter having an input coupled to the output of the fourth inverter and having an output coupled to the input of the third inverter, wherein the fifth inverter is coupled to the low voltage supply terminal. The voltage translator further includes a sixth inverter having input coupled to the output of the fifth inverter and having an output coupled to the output of the voltage translator, wherein sixth inverter is coupled to the low voltage supply terminal. The voltage translator may further include a seventh inverter coupled between the sixth inverter and the output of the voltage translator, wherein the sixth inverter has an input coupled to the output of the sixth inverter and an output coupled to provide the level shifted output signal, and wherein the seventh inverter is coupled to the low voltage supply terminal. The voltage translator may have a further characterization by which the first, second, third, fourth, fifth, and sixth inverters are further characterized as high voltage inverters, and the seventh inverter is further characterized as a low voltage inverter, wherein the low voltage inverter has a lower voltage tolerance as compared to the high voltage inverters. The voltage translator may have a further characterization by which the first, second, third, fourth, fifth, and sixth inverters are further characterized as high voltage inverters. The voltage translator may have a further characterization by which the fourth, fifth, and sixth inverters are for providing the level shifted output signal, and wherein first, second, and third inverters are for providing delay equalization control of the level shifted output signal. The voltage translator may have a further characterization by which the first, second, and third inverters provide the delay equalization control of the level shifted output signal during a calibration mode of the voltage translator. The voltage translator may further comprise selection circuitry which couples the calibration voltage supply terminal to the high voltage supply terminal during a calibration mode of the voltage translator and which couples the calibration voltage supply terminal to the low voltage supply terminal during a non-calibration mode of the voltage translator. The voltage translator may have a further characterization by which the selection circuitry couples the calibration voltage supply terminal to one of the high voltage supply terminal or the low voltage supply terminal in response to a calibration mode indicator signal which indicates whether the voltage translator is operating in the calibration mode or the non-calibration mode. The voltage translator may further comprise a seventh inverter having an input coupled to the output of the third inverter, wherein the seventh inverter is coupled to the low voltage supply terminal.

Disclosed also is a method for providing translating an input signal to a level shifted output signal. The method includes providing a first path comprising a plurality of inverters coupled in series, wherein the first path receives the input signal and provides the level shifted output signal. The method further includes providing a second path comprising a plurality of inverters coupled in series, wherein the second path receives the input signal and provides delay equalization control of the level shifted output signal provided by the first path, and wherein a first inverter (46) of the plurality of inverters in the first path and a second inverter of the plurality of inverters of the second path are cross-coupled with each other. providing the first path is further characterized by the first inverter being coupled to a low voltage supply terminal and wherein the providing the second path is further characterized by the second inverter being coupled to the low voltage supply terminal. The method may have a further characterization by which the providing the first path is further characterized by the plurality of inverters in the first path including a third inverter having an input coupled to receive the input signal and an output coupled to an input of the first inverter, and wherein the providing the second path is further characterized by the plurality of inverters of the second path including a fourth inverter having an output coupled to an input of the second inverter, wherein each of the third inverter and the fourth inverter is coupled to a calibration voltage supply terminal. The method may further comprise providing selection circuitry which couples the calibration voltage supply terminal to a high voltage supply terminal during a calibration mode and couples the calibration voltage supply terminal to the low voltage supply terminal during a non-calibration mode. The method may have a further characterization by which the providing the second path is further characterized by the plurality of inverters in the second path including a fifth inverter having an input coupled to receive the input signal and an output coupled to the input of the fourth inverter, wherein the fifth inverter is coupled to a high voltage supply terminal. The method may have a further characterization by which the first path provides the level shifted output signal and the second path provides the delay equalization control of the level shifted output signal only during a calibration mode. The method may have a further characterization by which the first path provides the level shifted output signal and the second path provides the delay equalization control of the level shifted output signal only during a calibration mode. The method may have a further characterization by which the providing the first path is further characterized by the plurality of inverters in the first path including a third inverter having an output to provide the level shifted output signal, wherein the third inverter is coupled to a low voltage supply terminal. The method may have a further characterization by which the providing the first path and the providing the second path are further characterized by the first and second inverters being high voltage inverters and the third inverter being a low voltage inverter, wherein the low voltage inverter has a lower voltage tolerance as compared to the high voltage inverters.

Also disclosed is a voltage translator having an input which receives an input signal and an output which provides a level shifted output signal, wherein the voltage translator translates the input signal to the level shifted output signal and the voltage translator is coupled to a high voltage supply terminal and a low voltage supply terminal. The voltage translator further includes a first high voltage inverter having an input coupled to receive the input signal and having an output, wherein the first high voltage inverter is coupled to the high voltage supply terminal. The voltage translator further includes a second high voltage inverter having an input coupled to the output of the first high voltage inverter and having in output, wherein the second high voltage inverter is coupled to a calibration voltage supply terminal. The voltage translator further includes a third high voltage inverter having an input coupled to the output of the second high voltage inverter and having an output, wherein the first low voltage inverter is coupled to the low voltage supply terminal. The voltage translator further includes a fourth high voltage inverter having an input coupled to the output of the third high voltage inverter, wherein the fourth high voltage inverter is coupled to the low voltage supply terminal. The voltage translator further includes a fifth high voltage inverter having an input coupled to receive the input signal and having an output coupled to the output of the third high voltage inverter, wherein the fifth high voltage inverter is coupled to the calibration voltage supply terminal. The voltage translator further includes a sixth high voltage inverter having an input coupled to the output of the fifth high voltage inverter and having an output coupled to the input of the third high voltage inverter, wherein the sixth high voltage inverter is coupled to the low voltage supply terminal. The voltage translator further includes a seventh high voltage inverter having input coupled to the output of the sixth high voltage inverter and having an output, wherein the seventh high voltage inverter is coupled to the low voltage supply terminal. The voltage translator further includes a first low voltage inverter having an input coupled to the output of the seventh high voltage inverter and having an output coupled to provide the level shifted output signal, wherein the first low voltage inverter is coupled to the low voltage supply terminal. The voltage translator further includes selection circuitry which couples the calibration voltage supply terminal to the high voltage supply terminal during a calibration mode of the voltage translator and which couples the calibration voltage supply terminal to the low voltage supply terminal during a non-calibration mode of the voltage translator. The method may have a further characterization by which, during the calibration mode, the fifth, sixth, and seventh high voltage inverters and the first low voltage inverter are for providing the level shifted output signal, and the first, second, third, and fourth high voltage inverters are for providing delay equalization control of the level shifted output signal. The method may have a further characterization by which wherein the selection circuitry couples the calibration voltage supply terminal to one of the high voltage supply terminal or the low voltage supply terminal in response to a calibration mode indicator signal which indicates whether the voltage translator is operating in the calibration mode or the non-calibration mode.

Although the invention is described herein with reference to specific embodiments, various modifications and changes can be made without departing from the scope of the present invention as set forth in the claims below. For example, a particular benefit described was for a voltage translator that was effective in replicating a duty cycle, but another useful purpose may also be obtained. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A voltage translator having an input which receives an input signal and an output which provides a level shifted output signal, wherein the voltage translator translates the input signal to the level shifted output signal, the voltage translator coupled to a high voltage supply terminal and a low voltage supply terminal, the voltage translator comprising:
    a first inverter having an input coupled to receive the input signal and having an output, wherein the first inverter is coupled to the high voltage supply terminal;
    a second inverter having an input coupled to the output of the first inverter and having in output, wherein the second inverter is coupled to a calibration voltage supply terminal;
    a third inverter having an input coupled to the output of the second inverter and having an output, wherein the third inverter is coupled to the low voltage supply terminal;
    a fourth inverter having an input coupled to receive the input signal and having an output coupled to the output of the third inverter, wherein the fourth inverter is coupled to the calibration voltage supply terminal;
    a fifth inverter having an input coupled to the output of the fourth inverter and having an output coupled to the input of the third inverter, wherein the fifth inverter is coupled to the low voltage supply terminal; and
    a sixth inverter having input coupled to the output of the fifth inverter and having an output coupled to the output of the voltage translator, wherein sixth inverter is coupled to the low voltage supply terminal.

2. The voltage translator of claim 1, further comprising:
    a seventh inverter coupled between the sixth inverter and the output of the voltage translator, wherein the sixth inverter has an input coupled to the output of the sixth inverter and an output coupled to provide the level shifted output signal, and wherein the seventh inverter is coupled to the low voltage supply terminal.

3. The voltage translator of claim 2, wherein the first, second, third, fourth, fifth, and sixth inverters are further characterized as high voltage inverters, and the seventh inverter is further characterized as a low voltage inverter, wherein the low voltage inverter has a lower voltage tolerance as compared to the high voltage inverters.

4. The voltage translator of claim 1, wherein the first, second, third, fourth, fifth, and sixth inverters are further characterized as high voltage inverters.

5. The voltage translator of claim 1, wherein the fourth, fifth, and sixth inverters are for providing the level shifted output signal, and wherein first, second, and third inverters are for providing delay equalization control of the level shifted output signal.

6. The voltage translator of claim 5, wherein the first, second, and third inverters provide the delay equalization control of the level shifted output signal during a calibration mode of the voltage translator.

7. The voltage translator of claim 1, further comprising:
    selection circuitry which couples the calibration voltage supply terminal to the high voltage supply terminal during a calibration mode of the voltage translator and which couples the calibration voltage supply terminal to the low voltage supply terminal during a non-calibration mode of the voltage translator.

8. The voltage translator of claim 7, wherein the selection circuitry couples the calibration voltage supply terminal to one of the high voltage supply terminal or the low voltage supply terminal in response to a calibration mode indicator signal which indicates whether the voltage translator is operating in the calibration mode or the non-calibration mode.

9. The voltage translator of claim 1, further comprising:
    a seventh inverter having an input coupled to the output of the third inverter, wherein the seventh inverter is coupled to the low voltage supply terminal.

10. A method for providing translating an input signal to a level shifted output signal, comprising:
    providing a first path comprising a plurality of inverters coupled in series, wherein the first path receives the input signal and provides the level shifted output signal; and providing a second path comprising a plurality of inverters coupled in series, wherein the second path receives the input signal and provides delay equalization control of the level shifted output signal provided by the first path, and wherein a first inverter (46) of the plurality of inverters in the first path and a second inverter of the plurality of inverters of the second path are cross-coupled with each other, wherein the providing the first path is further characterized by the plurality of inverters in the first path including a third inverter having an input coupled to receive the input signal and an output coupled to an input of the first inverter, and wherein the providing the second path is further characterized by the plurality of inverters of the second path including a fourth inverter having an output coupled to an input of the second inverter, wherein each of the third inverter and the fourth inverter is coupled to a calibration voltage supply terminal, and wherein the providing the first path is further characterized by the first inverter being coupled to a low voltage supply terminal and wherein the providing the second path is further characterized by the second inverter being coupled to the low voltage supply terminal.

11. The method of claim 10, further comprising:
providing selection circuitry which couples the calibration voltage supply terminal to a high voltage supply terminal during a calibration mode and couples the calibration voltage supply terminal to the low voltage supply terminal during a non-calibration mode.

12. The method of claim 10, wherein the providing the second path is further characterized by the plurality of inverters in the second path including a fifth inverter having an input coupled to receive the input signal and an output coupled to the input of the fourth inverter, wherein the fifth inverter is coupled to a high voltage supply terminal.

13. A method of claim 10 for providing translating an input signal to a level shifted output signal, comprising:
providing a first path comprising a plurality of inverters coupled in series, wherein the first path receives the input signal and provides the level shifted output signal; and providing a second path comprising a plurality of inverters coupled in series, wherein the second path receives the input signal and provides delay equalization control of the level shifted output signal provided by the first path, and wherein a first inverter (46) of the plurality of inverters in the first path and a second inverter of the plurality of inverters of the second path are cross-coupled with each other, wherein the first path provides the level shifted output signal and the second path provides the delay equalization control of the level shifted output signal only during a calibration mode.

14. A voltage translator having an input which receives an input signal and an output which provides a level shifted output signal, wherein the voltage translator translates the input signal to the level shifted output signal, the voltage translator coupled to a high voltage supply terminal and a low voltage supply terminal, the voltage translator comprising:

a first high voltage inverter having an input coupled to receive the input signal and having an output, wherein the first high voltage inverter is coupled to the high voltage supply terminal;

a second high voltage inverter having an input coupled to the output of the first high voltage inverter and having in output, wherein the second high voltage inverter is coupled to a calibration voltage supply terminal;

a third high voltage inverter having an input coupled to the output of the second high voltage inverter and having an output, wherein the first low voltage inverter is coupled to the low voltage supply terminal;

a fourth high voltage inverter having an input coupled to the output of the third high voltage inverter, wherein the fourth high voltage inverter is coupled to the low voltage supply terminal;

a fifth high voltage inverter having an input coupled to receive the input signal and having an output coupled to the output of the third high voltage inverter, wherein the fifth high voltage inverter is coupled to the calibration voltage supply terminal;

a sixth high voltage inverter having an input coupled to the output of the fifth high voltage inverter and having an output coupled to the input of the third high voltage inverter, wherein the sixth high voltage inverter is coupled to the low voltage supply terminal;

a seventh high voltage inverter having input coupled to the output of the sixth high voltage inverter and having an output, wherein the seventh high voltage inverter is coupled to the low voltage supply terminal;

a first low voltage inverter having an input coupled to the output of the seventh high voltage inverter and having an output coupled to provide the level shifted output signal, wherein the first low voltage inverter is coupled to the low voltage supply terminal; and selection circuitry which couples the calibration voltage supply terminal to the high voltage supply terminal during a calibration mode of the voltage translator and which couples the calibration voltage supply terminal to the low voltage supply terminal during a non-calibration mode of the voltage translator.

15. The voltage translator of claim 14, wherein, during the calibration mode, the fifth, sixth, and seventh high voltage inverters and the first low voltage inverter are for providing the level shifted output signal, and the first, second, third, and fourth high voltage inverters are for providing delay equalization control of the level shifted output signal.

16. The voltage translator of claim 14, wherein the selection circuitry couples the calibration voltage supply terminal to one of the high voltage supply terminal or the low voltage supply terminal in response to a calibration mode indicator signal which indicates whether the voltage translator is operating in the calibration mode or the non-calibration mode.

* * * * *

UNITED STATES PATENT AND TRADEMARK OFFICE
CERTIFICATE OF CORRECTION

| | |
|---|---|
| PATENT NO. | : 7,816,948 B1 |
| APPLICATION NO. | : 12/481319 |
| DATED | : October 19, 2010 |
| INVENTOR(S) | : Hector Sanchez |

It is certified that error appears in the above-identified patent and that said Letters Patent is hereby corrected as shown below:

In the Claims

In Column 9, line 36, Claim 13 please change "A method of claim 10 for providing" to be
--A method for providing--

Signed and Sealed this
Thirteenth Day of August, 2013

Teresa Stanek Rea
*Acting Director of the United States Patent and Trademark Office*